(12) United States Patent
Kim (10) Patent No.: US 12,007,445 B2
(45) Date of Patent: Jun. 11, 2024

(54) BATTERY APPARATUS, BATTERY MANAGEMENT SYSTEM, AND METHOD OF DIAGNOSING SUPPLY VOLTAGE OF CONTACTOR

(71) Applicant: LG ENERGY SOLUTION, LTD., Seoul (KR)

(72) Inventor: Sookwon Kim, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 218 days.

(21) Appl. No.: 17/634,677

(22) PCT Filed: Jul. 6, 2021

(86) PCT No.: PCT/KR2021/008544
§ 371 (c)(1),
(2) Date: Feb. 11, 2022

(87) PCT Pub. No.: WO2022/019526
PCT Pub. Date: Jan. 27, 2022

(65) Prior Publication Data
US 2022/0268841 A1    Aug. 25, 2022

(30) Foreign Application Priority Data
Jul. 22, 2020 (KR) .................. 10-2020-0091092

(51) Int. Cl.
*G01R 31/364* (2019.01)
*G01R 19/165* (2006.01)
*G01R 31/3835* (2019.01)

(52) U.S. Cl.
CPC ..... *G01R 31/364* (2019.01); *G01R 19/16566* (2013.01); *G01R 31/3835* (2019.01)

(58) Field of Classification Search
None
See application file for complete search history.

(56) References Cited

U.S. PATENT DOCUMENTS

| 5,166,854 A | 11/1992 | Morishige |
| 2006/0087775 A1 | 4/2006 | Osawa |
| 2014/0002939 A1 | 1/2014 | Grupido |

(Continued)

FOREIGN PATENT DOCUMENTS

| CN | 109515346 A | 3/2019 |
| CN | 110678764 A | 1/2020 |

(Continued)

OTHER PUBLICATIONS

International Search Report for PCT/KR2021/008544 (PCT/ISA/210) mailed on Nov. 9, 2021.

(Continued)

*Primary Examiner* — Jas A Sanghera
(74) *Attorney, Agent, or Firm* — Birch, Stewart, Kolasch & Birch, LLP (57) ABSTRACT

A plurality of driving circuits drive a plurality of contactors for connecting the battery pack and an external apparatus, respectively, based on a supply voltage. A processing circuitry control the plurality of driving circuits to sequentially close the plurality of contactors in a predetermined order, and check the supply voltage before closing each of the contactors.

17 Claims, 4 Drawing Sheets

(56) References Cited

U.S. PATENT DOCUMENTS

| | | |
|---|---|---|
| 2014/0125290 A1 | 5/2014 | Kim et al. |
| 2015/0015300 A1 | 1/2015 | Simonson et al. |
| 2015/0185271 A1 | 7/2015 | Kim et al. |
| 2015/0270081 A1* | 9/2015 | Hartl ............... G01R 31/3278 361/170 |
| 2015/0346283 A1* | 12/2015 | Kwon ................. B60L 58/10 702/63 |
| 2019/0011504 A1 | 1/2019 | Kim et al. |
| 2019/0084424 A1* | 3/2019 | Wand ................. B60L 50/51 |
| 2019/0267679 A1 | 8/2019 | Lee |
| 2020/0124672 A1 | 4/2020 | Cho et al. |
| 2020/0166574 A1 | 5/2020 | Lee |
| 2021/0091425 A1 | 3/2021 | Yamamoto et al. |
| 2021/0234383 A1 | 7/2021 | Lee et al. |

FOREIGN PATENT DOCUMENTS

| | | |
|---|---|---|
| JP | 2008-267717 A | 11/2008 |
| JP | 2010-57290 A | 3/2010 |
| JP | 2013-54920 A | 3/2013 |
| JP | 2014-525221 A | 9/2014 |
| JP | 2017-136971 A | 8/2017 |
| JP | 2019-186077 A | 10/2019 |
| JP | 2019-213332 A | 12/2019 |
| KR | 2001-0077547 A | 8/2001 |
| KR | 10-2013-0062023 A | 6/2013 |
| KR | 10-1314114 B1 | 10/2013 |
| KR | 10-2015-0007979 A | 1/2015 |
| KR | 10-2018-0008224 A | 1/2018 |
| KR | 10-2018-0056175 A | 5/2018 |
| KR | 10-1991910 B1 | 6/2019 |
| KR | 10-2020643 B1 | 9/2019 |
| KR | 10-2044598 B1 | 11/2019 |
| KR | 10-2020-0053376 A | 5/2020 |

OTHER PUBLICATIONS

Extended European Search Report for European Application No. 21846402.2, dated Nov. 17, 2022.

\* cited by examiner

BATTERY APPARATUS, BATTERY MANAGEMENT SYSTEM, AND METHOD OF DIAGNOSING SUPPLY VOLTAGE OF CONTACTOR

CROSS-REFERENCE TO RELATED APPLICATION

This application claims priority to and the benefit of Korean Patent Application No. 10-2020-0091092 filed in the Korean Intellectual Property Office on Jul. 22, 2020, the entire contents of which are incorporated herein by reference.

TECHNICAL FIELD

The described technology relates to a battery apparatus, a battery management system, and a method of diagnosing a supply voltage of a contactor.

BACKGROUND ART

An electric vehicle is a vehicle that obtains power by driving a motor mainly using a battery as a power supply. The electric vehicles are being actively researched because they are alternatives that can solve pollution and energy problems of internal combustion vehicles. Rechargeable batteries are used in various external apparatuses other than the electric vehicles.

In order to supply power from the battery to the external apparatus such as the vehicle or the electronic device or to charge a battery module, a contactor is provided between an external link terminal for connection with the external apparatus and the battery. The contactor is also provided between the external link terminal and a positive terminal of the battery to pre-charge a capacitor of the external apparatus.

When a relay is used as the contactor, an insufficient voltage may be supplied to a relay coil if a peak voltage of the power supplied to the relay coil is not stabilized when the contactor is closed. As a result, the contactor may be not closed completely and a fault may occur.

DISCLOSURE

Technical Problem

Some embodiments may provide a battery apparatus, a battery management system, and a method of diagnosing a supply voltage of a contactor that can prevent a fault to be caused by the contactor not closing.

Technical Solution

According to an embodiment, a battery apparatus including a battery pack, a plurality of contactors configured to connect the battery pack and an external apparatus, a plurality of driving circuits configured to drive the plurality of contactors based on a supply voltage, respectively, and a processing circuitry is provided. The processing circuitry may control the plurality of driving circuits to sequentially close the plurality of contactors in a predetermined order, and check the supply voltage before closing each of the contactors.

In some embodiments, the plurality of contactors may include a first contactor connected between a negative terminal of the battery pack and a negative link terminal for connection with the external apparatus, a second contactor for pre-charging, connected between a positive terminal of the battery pack and a positive link terminal for connection with the external apparatus, and a third contactor connected between the positive terminal of the battery pack and the positive link terminal. The processing circuitry may close the plurality of contactors in an order of the first contactor, the second contactor, and the third contactor, check the supply voltage before closing the first contactor, check the supply voltage before closing the second contactor, and check the supply voltage before closing the third contactor.

In some embodiments, the processing circuitry may compare the supply voltage with a predetermined voltage before closing each of the plurality of contactors, and close a corresponding one of the plurality of contactors in response to the supply voltage being equal to or higher than the predetermined voltage.

In some embodiments, in response to the supply voltage being lower than the predetermined voltage, the processing circuitry may compare the supply voltage with the predetermined voltage after waiting for a predetermined time.

In some embodiments, in response to a number of times of comparing the supply voltage with the predetermined voltage reaching a predetermined number of times, the processing circuitry may diagnose that there is a fault in the supply voltage.

In some embodiments, the processing circuitry may count a counter each time the supply voltage is compared with the predetermined voltage, and diagnose that there is the fault in the supply voltage in response to a count value of the counter reaching a predetermined value.

In some embodiments, each of the plurality of contactors may include a switch and a relay coil, and the supply voltage may be a voltage that drives the relay coil of each of the plurality of contactors.

According to another embodiment, a method of diagnosing a supply voltage configured to drive a plurality of contactors including a first contactor and a second contactor configured to connect a battery pack and an external apparatus is provided. The method may include checking the supply voltage before closing the first contactor, comparing the supply voltage checked before closing the first contactor with a predetermined voltage, closing the first contactor in response to the supply voltage checked before closing the first contactor being equal to or higher than the predetermined voltage, checking the supply voltage before closing the second contactor, comparing the supply voltage checked before closing the second contactor with a predetermined voltage, and closing the second contactor in response to the supply voltage checked before closing the second contactor being equal to or higher than the predetermined voltage.

In some embodiments, the method may further include, in response to the supply voltage checked before closing the first contactor being lower than the predetermined voltage, comparing the supply voltage checked after waiting for a predetermined time with the predetermined voltage.

In some embodiments, the method may further include diagnosing that there is a fault in the supply voltage in response to a number of times of comparing the supply voltage with the predetermined voltage reaching a predetermined number of times.

In some embodiments, the method may further include, in response to the supply voltage checked before closing the second contactor being lower than the predetermined voltage, comparing the supply voltage checked after waiting for a predetermined time with the predetermined voltage.

In some embodiments, the method may further include diagnosing that there is a fault in the supply voltage in response to a number of times of comparing the supply voltage with the predetermined voltage reaching a predetermined number of times.

According to yet another embodiment, a battery management system configured to control a plurality of contactors including a first contactor and a second contactor configured to connect a battery pack and an external apparatus is provided. The battery management system may include a first driving circuit configured to drive the first contactor based on a supply voltage, a second driving circuit configured to drive the second contactor based on the supply voltage, and a processing circuitry. The processing circuitry may check the supply voltage before closing the first contactor, control the first driving circuit to close the first contactor in response to the supply voltage checked before closing the first contactor being equal to or higher than a predetermined voltage, check the supply voltage before closing the second contactor, and control the second driving circuit to close the second contactor in response to the supply voltage checked before closing the second contactor being equal to or higher than a predetermined voltage.

Advantageous Effects

According to some embodiments, when a supply voltage of the contactor is insufficient, a fault in which a contactor is not closed due to the insufficient supply voltage of the contactor can be prevented by checking the supply voltage again after waiting for a predetermined time.

MODE FOR INVENTION

In the following detailed description, only certain embodiments have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

When it is described that an element is "connected" to another element, it should be understood that the element may be directly connected to the other element or connected to the other element through a third element. On the other hand, when it is described that an element is "directly connected" to another element, it should be understood that the element is connected to the other element through no third element.

As used herein, a singular form may be intended to include a plural form as well, unless the explicit expression such as "one" or "single" is used.

In flowcharts described with reference to the drawings, the order of operations or steps may be changed, several operations or steps may be merged, a certain operation or step may be divided, and a specific operation or step may not be performed.

Figure 1:
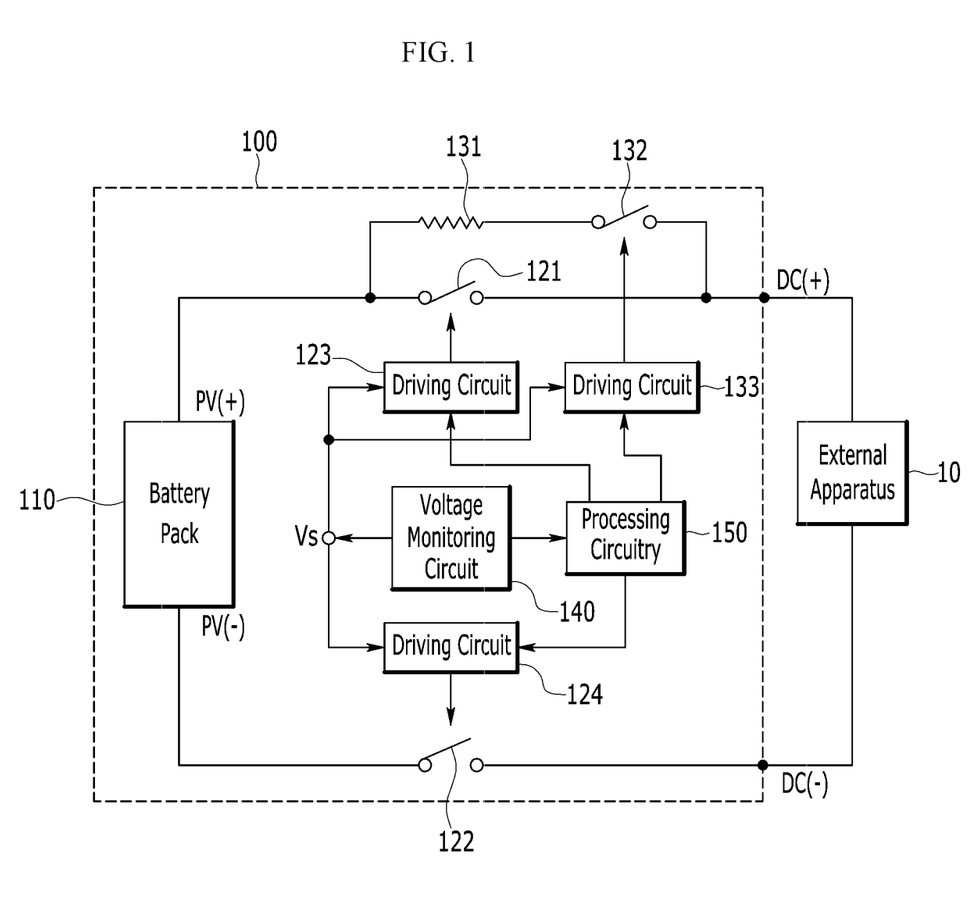
FIG. 1 is a diagram showing a battery apparatus according to an embodiment.

FIG. 1 is a diagram showing a battery apparatus according to an embodiment.

Referring to FIG. 1, a battery apparatus 100 has a structure that can be electrically connected to an external apparatus 10 through a positive link terminal DC(+) and a negative link terminal DC(−). When the external apparatus is a load, the battery apparatus 100 is discharged by operating as a power supply that supplies power to the load. The external apparatus 10 operating as the load may be, for example, an electronic device, a mobility apparatus, or an energy storage system (ESS). The mobility apparatus may be, for example, an electric vehicle, a hybrid vehicle, or a smart mobility.

The battery apparatus 100 includes a battery pack 110, a switch circuit, a pre-charge circuit, and a battery management system.

The battery pack 110 includes a plurality of battery cells, and has a positive terminal PV(+) and a negative terminal PV(−). In some embodiments, the battery cell may be a rechargeable cell. In one embodiment, in the battery pack 110, a predetermined number of battery cells are connected in series to configure a battery module to supply desired power. In another embodiment, in the battery pack 110, a predetermined number of battery modules may be connected in series or in parallel to supply desired power.

The switch circuit includes a positive main contactor 121 connected between the positive terminal PV(+) of the battery pack 110 and the positive link terminal DC(+) of the battery apparatus 100, and a negative main contactor 122 connected between the negative terminal PV(−) of the battery pack 110 and the negative link terminal DC(−) of the battery apparatus 100. In some embodiments, each of the contactors 121 and 122 may be a contactor implemented in a relay (e.g., implemented as a relay). In some embodiments, the switch circuit may further include driving circuits 123 and 124 for controlling the contactors 121 and 122, respectively.

The pre-charge circuit is connected between the positive terminal PV(+) of the battery pack 110 and the positive link terminal DC(+) of the battery apparatus 100, and may pre-charge a capacitor of the external apparatus 10 connected to the link terminals DC(+) and DC(−). In some embodiments, the pre-charge circuit may include a pre-charge resistor 131 and a pre-charge contactor 132 connected in series. In some embodiments, the pre-charge contactor 132 may be a contactor implemented in a relay (e.g., implemented as a relay). In some embodiments, the pre-charge circuit may further include a driving circuit 133 for controlling the contactor 132.

The battery management system includes a voltage monitoring circuit 140 and a processing circuitry 150. The voltage monitoring circuit 140 senses a voltage Vs supplied to the driving circuits 123, 124, and 133. The processing circuitry 150 controls timings at which the voltage monitoring circuit 140 senses the supply voltage Vs, and diagnoses the contactors 121, 122, and 132 based on the supply voltage Vs sensed by the voltage monitoring circuit 140.

In some embodiments, the processing circuitry 150 may control operations of the contactors 121, 122, and 132. In one embodiment, the processing circuitry 150 may pre-charge the capacitor of the external apparatus 10 through the battery pack 110 by first closing the negative main contactor 122 and then closing the pre-charge contactor 132. Next, the processing circuitry 150 may supply the voltage of the battery pack 110 to the external apparatus 10 by closing the positive main contactor 121. In this case, the processing circuitry 150 may open the pre-charge contactor 132. Accordingly, the voltage pre-charged in the capacitor of the external apparatus 10 can prevent overcurrent from occurring when the external apparatus 10 is connected.

In some embodiments, the processing circuitry 150 may be a circuitry including a processor, and the processor may be, for example, a micro controller unit (MCU).

Figure 2:
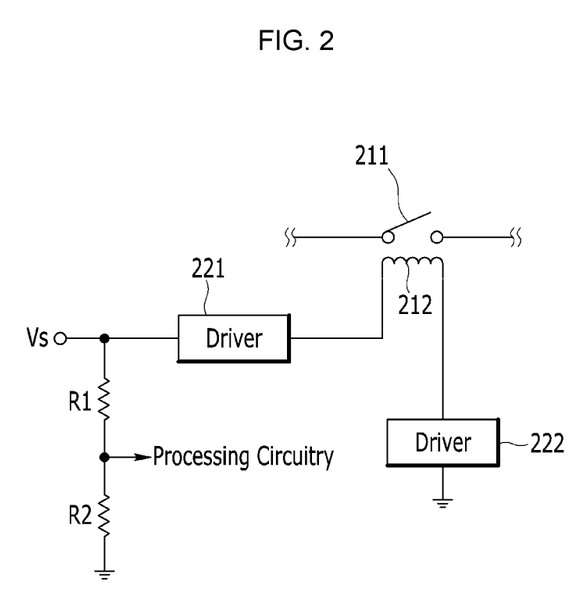
FIG. 2 is a diagram for explaining a contactor and a driving circuit according to an embodiment.

FIG. 2 is a diagram for explaining a contactor and a driving circuit according to an embodiment.

Referring to FIG. 2, a contactor includes a relay switch 211 and a relay coil 212. A driving circuit includes a first driver 221 connected between a power supply and a first terminal of the relay coil 212, and a second driver 222 connected between a second terminal of the relay coil 212 and a ground terminal. In some embodiments, the driving circuit may use only one of the drivers 221 and 222. The power supply supplies a voltage Vs for driving the relay coil 212. The voltage Vs may be, for example, 12V.

The first driver 221 and the second driver 222 are driven by a processing circuitry (150 in FIG. 1). The processing circuitry 150 enables the first driver 221 and the second driver 222 to supply the voltage Vs of the power supply to the relay coil 212. Accordingly, the switch 211 can be closed by the relay coil 212.

In some embodiments, a voltage monitoring circuit may be connected to the power supply. For example, the voltage monitoring circuit may include two resistors R1 and R2 connected in series between the power supply and the ground terminal. The voltage Vs may be divided by the two resistors R1 and R2, and the divided voltage may be transferred to the processing circuitry 150. In one embodiment, the voltage monitoring circuit may further include an analog-to-digital converter for converting the divided voltage into a digital signal. The processing circuitry 150 may determine whether the voltage Vs of the power supply detected by the voltage monitoring circuit is a stable voltage.

Although FIG. 2 shows one contactor and a driving circuit for driving the contactor, the power supply shown in FIG. 2 may also supply the voltage Vs to a driving circuit for driving the other contactor.

Next, a method of diagnosing a supply voltage of a contactor in a battery apparatus according to an embodiment is described with reference to FIG. 3 to FIG. 5.

Figure 3:
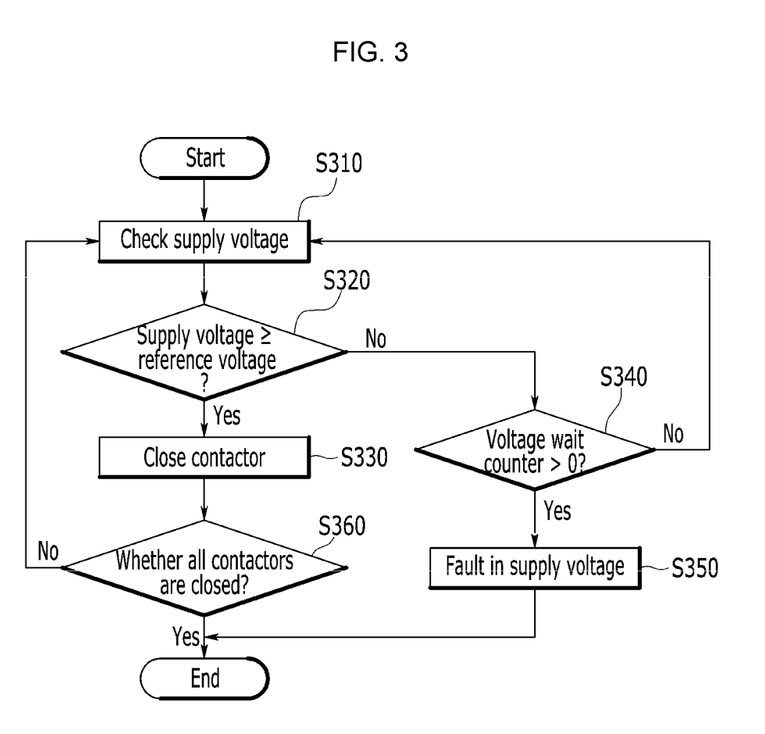
FIG. 3 is a flowchart showing a method of diagnosing a supply voltage of a contactor in a battery apparatus according to an embodiment.

FIG. 3 is a flowchart showing a method of diagnosing a supply voltage of a contactor in a battery apparatus according to an embodiment. FIG. 4 is a diagram showing switching timings of contactors in a battery apparatus according to an embodiment. FIG. 5 is a diagram showing general switching timings of contactors.

Figure 4:
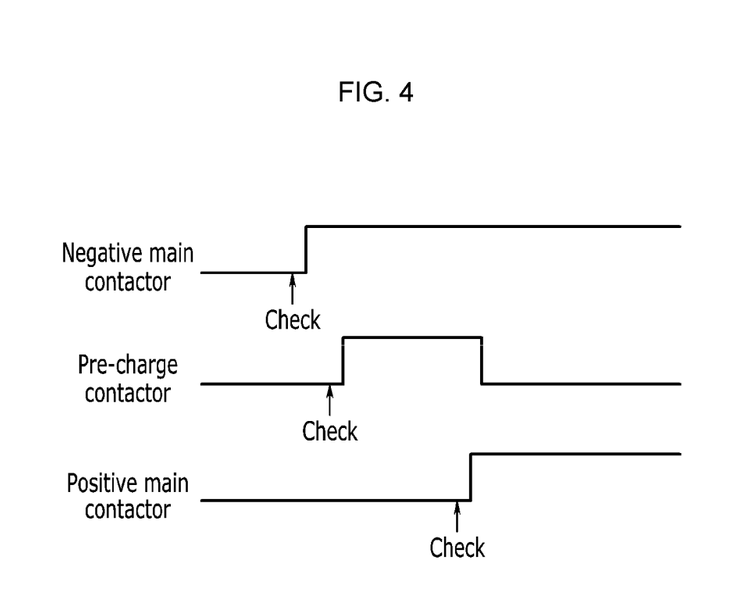
FIG. 4 is a diagram showing switching timings of contactors in a battery apparatus according to an embodiment.
Figure 5:
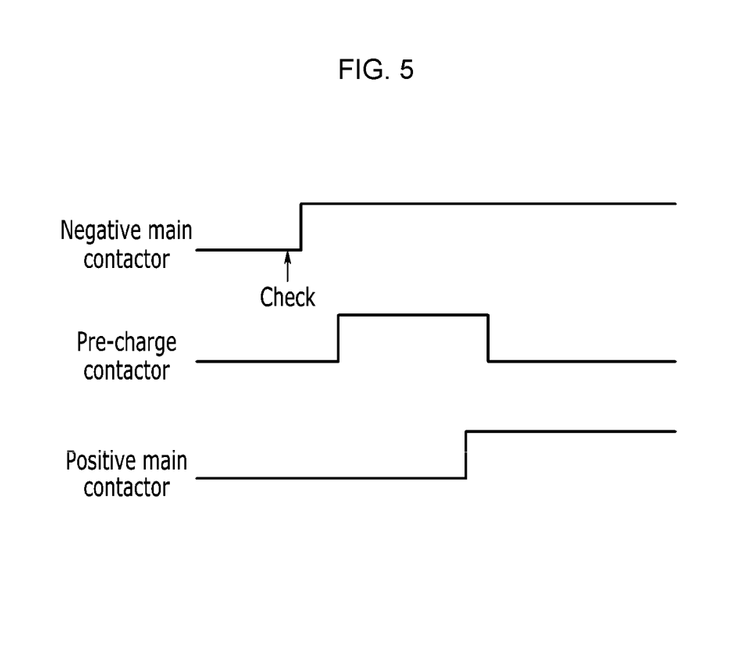
FIG. 5 is a diagram showing general switching timings of contactors.

Referring to FIG. 3 and FIG. 4, a processing circuitry (150 in FIG. 1) of a battery apparatus checks a voltage (Vs in FIG. 2) to be supplied to driving circuits of contactors (121, 122, and 132 in FIG. 1) before closing the contactors at step S310. When the supply voltage Vs is equal to or higher than a reference voltage corresponding to a stable voltage at step S320, the processing circuitry 150 closes the contactor 122 to be closed first among the contactors 121, 122, and 132 at step S330. The processing circuitry 150 may first close a negative main contactor 122 connected between a negative terminal PV(−) and a negative link terminal DC(−) of the battery apparatus among the various contactors 121, 122, and 132.

When the supply voltage Vs is lower than the reference voltage at step S320, the processing circuitry 150 checks the supply voltage Vs again after a predetermined time has elapsed at step S310. In some embodiments, the predetermined time may be short enough to not affect a timing of supplying power to the external apparatus. In one embodiment, the predetermined time may be determined based on a cycle of a clock signal used by the processing circuitry. In some embodiments, the processing circuitry 150 may use a voltage wait counter. In this case, the processing circuitry 150 may check the supply voltage Vs again when the voltage wait counter counts one. In one embodiment, the voltage wait counter may operate in synchronization with the clock signal. When the supply voltage Vs becomes equal to or higher than the reference voltage, the processing circuitry 150 closes the contactor 132 at step S330. When the supply voltage Vs is lower than the reference voltage at step S320, the processing circuitry 150 checks the supply voltage Vs again after the predetermined time has elapsed at step S310.

When the supply voltage Vs is lower than the reference voltage after checking the supply voltage Vs a predetermined number of times at step S340, the processing circuitry 150 diagnoses that there is a fault in the supply voltage of the contactor at step S350. In some embodiments, the predetermined number of times may be determined by a voltage wait counter. In one embodiment, if an initial value of the voltage wait counter is a value corresponding to the predetermined number of times and the voltage wait counter decrements by one each time the supply voltage Vs is checked, the processing circuitry 150 may determine that the supply voltage Vs is checked predetermined number of times when a count value of the voltage wait counter becomes a predetermined value (i.e., zero). In another embodiment, if the initial value of the voltage wait counter is zero and the voltage wait counter increments by one each time the supply voltage Vs is checked, the processing circuitry 150 may determine that the supply voltage Vs is checked the predetermined number of times when the count value of the voltage wait counter becomes a predetermined value. When the contactor is closed in response to the supply voltage Vs being equal to or higher than the reference voltage, the voltage standby counter may be initialized to the initial value. In FIG. 3, for convenience of description, a case of determining that the supply voltage Vs is checked the predetermined number of times when the count value of the voltage wait counter becomes zero is shown.

In some embodiments, when diagnosing that there is the fault in the supply voltage of the contactor at step S350 the processing circuitry 150 may output a diagnosis result indicating the fault in the supply voltage. In some embodiments, the processing circuitry 150 may transmit a message including the diagnosis result to a processor of an external apparatus (e.g., a vehicle) to which the battery apparatus is connected. Then, the processor of the external apparatus may notify the diagnosis result so that the user can check the fault in the supply voltage. For example, the processor may notify the diagnosis result by displaying the diagnosis result on a display device of the external apparatus or outputting a warning sound.

Next, the processing circuitry 150 checks the supply voltage Vs again before closing the contactor 132 of a next timing at step S310 after closing the negative main contactor 122. In order to prevent overcurrent from occurring when the external apparatus is connected to the battery apparatus, the pre-charge contactor 132 may be closed after the negative main contactor 122 is closed. As described above, the processing circuitry 150 compares the supply voltage Vs with the reference voltage at step S320 before closing the pre-charge contactor 132. When the supply voltage Vs is equal to or higher than the reference voltage at step S320, the processing circuitry 150 closes the pre-charge contactor 132 at step S330. When the supply voltage Vs is lower than the reference voltage at step S320, the processing circuitry 150 checks the supply voltage Vs again after the predetermined time has elapsed at step S310. When the supply voltage Vs is lower than the reference voltage after checking the supply voltage Vs the predetermined number of times at step S340, the processing circuitry 150 diagnoses that there is a fault in the supply voltage of the contactor at step S350.

Next, the processing circuitry 150 checks the supply voltage Vs again before closing the contactor 121 of a next timing at step S310 after closing the pre-charge contactor 132. After pre-charging the capacitor of the external apparatus, the processing circuitry 150 may close the positive main contactor 121 to supply the voltage of the battery apparatus to the external apparatus. In this case, since the pre-charge is completed, the processing circuitry 150 may open the pre-charge contactor 132. As described above, the processing circuitry 150 compares the supply voltage Vs with the reference voltage at step S320 before closing the positive main contactor 121. When the supply voltage Vs is equal to or higher than the reference voltage at step S320, the processing circuitry 150 closes the positive main contactor 121 at step S330. When the supply voltage Vs is lower than the reference voltage at step S320, the processing circuitry 150 checks the supply voltage Vs again after the predetermined time has elapsed at step S310. When the supply voltage Vs is lower than the reference voltage after checking the supply voltage Vs the predetermined number of times at step S340, the processing circuitry 150 diagnoses that there is a fault in the supply voltage of the contactor at step S350.

When all of the contactors 121, 122, and 132 are normally closed at step S360, the processing circuitry 150 diagnoses that the supply voltage of the contactors is normal and ends the processing.

As described above, according to some embodiments, it is possible to close all contactors normally without fault since the supply voltage of the contactors is checked before closing each of the contactors. In contrast, as shown in FIG. 5, the supply voltage may be checked only before closing the first contactor 122 among the plurality of contactors 121, 122, and 132. In this case, when the supply voltage becomes unstable after closing the contactor 122 before closing the next contactor 121 and 132, a fault that the contactors 121 and 132 are not normally closed when signals for closing the contactors 121 and 132 are output to the contactors 121 and 132 may occur. However, according to some embodiments, if the supply voltage is unstable before closing each contactor, the supply voltage is checked again after waiting for a predetermined time. Since the supply voltage can be restored to the reference voltage by current flowing through a relay coil if waiting for the predetermined time, the contactor can be stably closed after the supply voltage is sufficient.

While this invention has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

The invention claimed is:

1. A battery apparatus, comprising:
a battery pack;
a plurality of contactors configured to connect the battery pack and an external apparatus;
a plurality of driving circuits configured to drive the plurality of contactors based on a supply voltage, respectively; and
a processing circuitry configured to control the plurality of driving circuits to sequentially close the plurality of contactors in a predetermined order, and check the supply voltage before closing each of the plurality of contactors.

2. The battery apparatus of claim 1, wherein the plurality of contactors includes:
a first contactor connected between a negative terminal of the battery pack and a negative link terminal for connection with the external apparatus;
a second contactor for pre-charging, connected between a positive terminal of the battery pack and a positive link terminal for connection with the external apparatus; and
a third contactor connected between the positive terminal of the battery pack and the positive link terminal, and
wherein the processing circuitry is configured to:
close the plurality of contactors in an order of the first contactor, the second contactor, and the third contactor;
check the supply voltage before closing the first contactor;
check the supply voltage before closing the second contactor; and
check the supply voltage before closing the third contactor.

3. The battery apparatus of claim 1, wherein the processing circuitry is configured to:
compare the supply voltage with a predetermined voltage before closing each of the plurality of contactors; and
close a corresponding one of the plurality of contactors in response to the supply voltage being equal to or higher than the predetermined voltage.

4. The battery apparatus of claim 3, wherein the processing circuitry is configured to, in response to the supply voltage being lower than the predetermined voltage, compare the supply voltage with the predetermined voltage after waiting for a predetermined time.

5. The battery apparatus of claim 4, wherein the processing circuitry is configured to, in response to a number of times of comparing the supply voltage with the predetermined voltage reaching a predetermined number of times, diagnose that there is a fault in the supply voltage.

6. The battery apparatus of claim 5, wherein the processing circuitry is configured to:
count a counter each time the supply voltage is compared with the predetermined voltage; and
diagnose that there is the fault in the supply voltage in response to a count value of the counter reaching a predetermined value.

7. The battery apparatus of claim 1, wherein each of the plurality of contactors includes a switch and a relay coil, and wherein the supply voltage is a voltage that drives the relay coil of each of the plurality of contactors.

8. The battery apparatus of claim 1, wherein the processing circuitry checks whether the supply voltage before closing each of the plurality of contactors is a stable voltage.

9. A method of diagnosing a supply voltage configured to drive a plurality of contactors including a first contactor and a second contactor configured to connect a battery pack and an external apparatus, the method comprising:

checking the supply voltage before closing the first contactor;
comparing the supply voltage checked before closing the first contactor with a predetermined voltage;
closing the first contactor in response to the supply voltage checked before closing the first contactor being equal to or higher than the predetermined voltage;
checking the supply voltage before closing the second contactor;
comparing the supply voltage checked before closing the second contactor with the predetermined voltage; and
closing the second contactor in response to the supply voltage checked before closing the second contactor being equal to or higher than the predetermined voltage.

10. The method of claim 9, further comprising, in response to the supply voltage checked before closing the first contactor being lower than the predetermined voltage, comparing the supply voltage checked after waiting for a predetermined time with the predetermined voltage.

11. The method of claim 10, further comprising diagnosing that there is a fault in the supply voltage in response to a number of times of comparing the supply voltage with the predetermined voltage reaching a predetermined number of times.

12. The method of claim 9, further comprising, in response to the supply voltage checked before closing the second contactor being lower than the predetermined voltage, comparing the supply voltage checked after waiting for a predetermined time with the predetermined voltage.

13. The method of claim 12, further comprising diagnosing that there is a fault in the supply voltage in response to a number of times of comparing the supply voltage with the predetermined voltage reaching a predetermined number of times.

14. The method of claim 9, wherein each of the plurality of contactors includes a switch and a relay coil, and
wherein the supply voltage is a voltage that drives the relay coil of each of the plurality of contactors.

15. The method of claim 9, wherein the checking of the supply voltage before closing the second contactor checks whether the supply voltage is a stable voltage.

16. A battery management system configured to control a plurality of contactors including a first contactor and a second contactor configured to connect a battery pack and an external apparatus, the battery management system comprising:
a first driving circuit configured to drive the first contactor based on a supply voltage;
a second driving circuit configured to drive the second contactor based on the supply voltage; and
a processing circuitry configured to:
check the supply voltage before closing the first contactor;
control the first driving circuit to close the first contactor in response to the supply voltage checked before closing the first contactor being equal to or higher than a predetermined voltage;
check the supply voltage before closing the second contactor; and
control the second driving circuit to close the second contactor in response to the supply voltage checked before closing the second contactor being equal to or higher than the predetermined voltage.

17. The battery management system of claim 16, wherein the processing circuitry checks whether the supply voltage before closing the second contactor is a stable voltage.

* * * * *